(12) United States Patent
Razdan et al.

(10) Patent No.: US 10,128,225 B2
(45) Date of Patent: Nov. 13, 2018

(54) INTERCONNECT STRUCTURES WITH POLYMER CORE

(71) Applicant: INTEL CORPORATION, Santa Clara, CA (US)

(72) Inventors: Sandeep Razdan, Chandler, AZ (US); Edward R. Prack, Phoenix, AZ (US); Sairam Agraharam, Chandler, AZ (US); Robert L. Sankman, Phoenix, AZ (US); Shan Zhong, Chandler, AZ (US); Robert M. Nickerson, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/436,291

(22) Filed: Feb. 17, 2017

(65) Prior Publication Data

US 2017/0229438 A1    Aug. 10, 2017

Related U.S. Application Data

(62) Division of application No. 14/621,936, filed on Feb. 13, 2015, now Pat. No. 9,613,934, which is a division
(Continued)

(51) Int. Cl.
*H01L 25/00* (2006.01)
*H01L 21/56* (2006.01)
(Continued)

(52) U.S. Cl.
CPC ............ *H01L 25/50* (2013.01); *H01L 21/565* (2013.01); *H01L 23/3128* (2013.01);
(Continued)

(58) Field of Classification Search
None
See application file for complete search history.

(56) References Cited

U.S. PATENT DOCUMENTS

| 2003/0202332 | A1 | 10/2003 | Reinikainen et al. |
| 2014/0203443 | A1* | 7/2014 | Pagaila ................. H01L 21/568 257/773 |
| 2015/0348895 | A1* | 12/2015 | Sen .......................... H01L 24/48 257/774 |

OTHER PUBLICATIONS

Non-Final Office Action dated Jun. 24, 2014 for U.S. Appl. No. 13/829,483, 8 pages.
(Continued)

*Primary Examiner* — Long Pham
(74) *Attorney, Agent, or Firm* — Schwabe, Williamson & Wyatt, P.C.

(57) ABSTRACT

Embodiments of the present disclosure are directed towards techniques and configurations of interconnect structures having a polymer core in integrated circuit (IC) package assemblies. In one embodiment, an apparatus includes a first die having a plurality of transistor devices disposed on an active side of the first die and a plurality of interconnect structures electrically coupled with the first die, wherein individual interconnect structures of the plurality of interconnect structures have a polymer core, and an electrically conductive material disposed on the polymer core, the electrically conductive material being configured to route electrical signals between the transistor devices of the first die and a second die. Other embodiments may be described and/or claimed.

7 Claims, 9 Drawing Sheets

Related U.S. Application Data of application No. 13/829,483, filed on Mar. 14, 2013, now Pat. No. 8,987,918.

(51) Int. Cl.
*H01L 23/00* (2006.01)
*H01L 23/532* (2006.01)
*H01L 23/528* (2006.01)
*H01L 25/065* (2006.01)
*H01L 23/31* (2006.01)

(52) U.S. Cl.
CPC ........ *H01L 23/528* (2013.01); *H01L 23/5329* (2013.01); *H01L 23/53228* (2013.01); *H01L 23/53242* (2013.01); *H01L 24/17* (2013.01); *H01L 24/81* (2013.01); *H01L 25/0657* (2013.01); *H01L 2224/0401* (2013.01); *H01L 2224/0557* (2013.01); *H01L 2224/12105* (2013.01); *H01L 2224/13005* (2013.01); *H01L 2224/16113* (2013.01); *H01L 2224/16225* (2013.01); *H01L 2224/16227* (2013.01); *H01L 2224/2929* (2013.01); *H01L 2224/81815* (2013.01); *H01L 2225/06513* (2013.01); *H01L 2225/06517* (2013.01); *H01L 2225/06541* (2013.01)

(56) References Cited

OTHER PUBLICATIONS

Notice of Allowance dated Nov. 28, 2014 for U.S. Appl. No. 13/829,483, 5 pages.
Non-Final Office Action dated Feb. 9, 2016 for U.S. Appl. No. 14/621,936, 13 pages.
Notice of Allowance dated Dec. 2, 2016 for U.S. Appl. No. 14/621,936, 7 pages.

* cited by examiner

INTERCONNECT STRUCTURES WITH POLYMER CORE

RELATED APPLICATIONS

This application is a divisional application of U.S. patent application Ser. No. 14/621,936, entitled "INTERCONNECT STRUCTURES WITH POLYMER CORE", filed Feb. 13, 2015 which is a divisional application of U.S. patent application Ser. No. 13/829,483, entitled "INTERCONNECT STRUCTURES WITH POLYMER CORE", filed Mar. 14, 2013, now U.S. Pat. No. 8,987,918, and claims priority to the Ser. Nos. 14/621,936 and 13/829,483 applications. The Specifications of Ser. Nos. 14/621,936 and 13/829,483 are hereby fully incorporated by reference.

FIELD

Embodiments of the present disclosure generally relate to the field of integrated circuits, and more particularly, to techniques and configurations of interconnect structures having a polymer core in integrated circuit (IC) package assemblies.

BACKGROUND

First-level interconnect (FLI) structures may include bulk solder interconnect structures to couple a die with another component (e.g., another die or substrate) of an integrated circuit (IC) package assembly. As dies continue to shrink to smaller dimensions, a pitch between individual structures of the FLI structures may also shrink and present various process and/or reliability risks for bulk solder interconnect structures. For example, in a thermocompression (TCB) bonding technique, defects associated with solder bridging may occur where solder on adjacent pillars/pads fuses together during reflow. Smaller pitch between FLI structures may further result in undesirable solder wicking that may lead to voids due to contraction and/or reaction of intermetallic compound formed during reflow. These defects may exacerbate stresses on inter-layer dielectric (ILD) or other stress junctions (e.g., passivation layer) resulting in delamination and/or cracks that compromise the reliability of the IC package assembly. Such defects may presently be mitigated by increasing control of solder volume and/or bonding/retract force requirements, however such control may be approaching limits of current technologies.

Further, through-mold interconnects (TMIs) are emerging in package-on-package (PoP) IC package assemblies to reduce an overall height of the package assembly (e.g., for mobile devices). A height of solder in the TMIs may be dependent on various factors including height of the molding compound, die thickness and package warpage effects. It may be desirable to control height and/or collapse of solder and reduce defects associated with solder bridging or ball merging in such PoP assemblies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
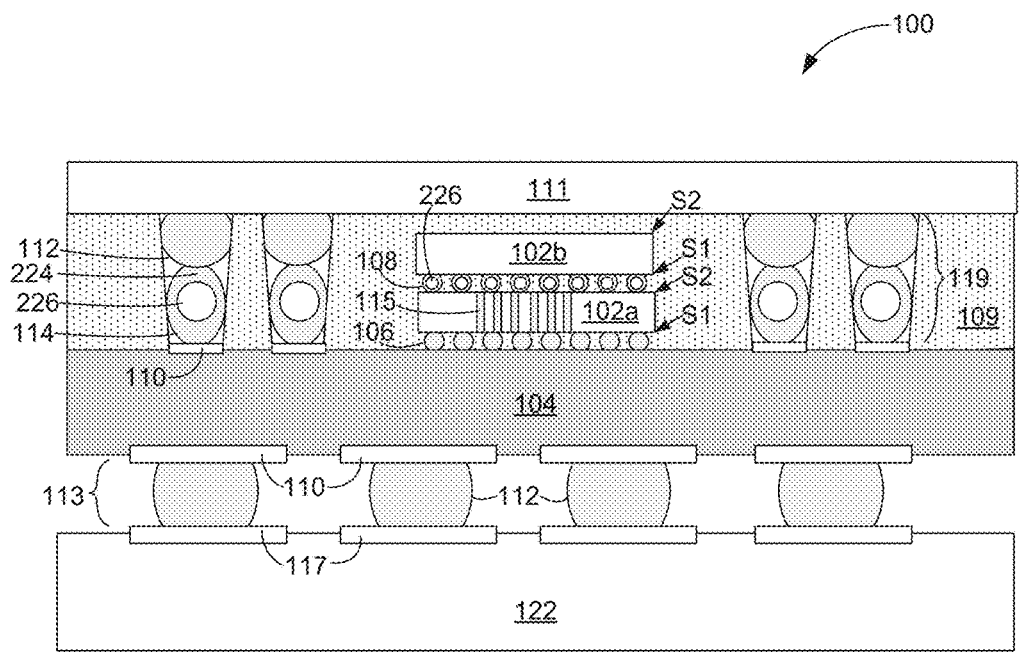
FIG. 1 schematically illustrates a cross-section side view of an example integrated circuit (IC) package assembly, in accordance with some embodiments.

Embodiments of the present disclosure describe techniques and configurations of interconnect structures having a polymer core in integrated circuit (IC) package assemblies. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100, in accordance with some embodiments. The IC package assembly 100 may include a first die 102a and second die 102b coupled together using one or more interconnect structures having a polymer core 226 (hereinafter "interconnect structures 108"). In some embodiments, the IC package assembly 100 may further include a package substrate (hereinafter "substrate 104") coupled with the first die 102a and/or the second die 102b. The substrate 104 may be coupled with a package-on-package (PoP) component 111 using one or more interconnect structures having a polymer core 226 (hereinafter "interconnect structures 114"). In some embodiments, the substrate 104 may be coupled with a circuit board 122.

According to various embodiments, the first die 102a can be attached to the substrate 104 according to a variety of suitable configurations including, a flip-chip configuration, as depicted, or other configurations such as wirebonding and the like. In the flip-chip configuration, an active side, S1, of the first die 102a is attached to a surface of the substrate 104 using die interconnect structures 106 such as bumps, pillars, or other suitable structures. The active side S1 of the first die 102a may have one or more transistor devices formed thereon.

The die interconnect structures 106 may be configured to route electrical signals between the first die 102a and the substrate 104. In some embodiments, the electrical signals may include, for example, input/output (I/O) signals and/or power or ground signals associated with the operation of the first die 102a.

In some embodiments, the first die 102a may include one or more through-silicon vias (hereinafter "TSVs 115") formed through the first die 102a to electrically couple an inactive side, S2, of the first die 102a with the active side S1 of the first die 102a. As can be seen, the active side S1 of the first die 102a may be disposed opposite to the inactive side S2 of the first die 102a. The TSVs 115 may be filled with an electrically conductive material such as metal.

In some embodiments, a second die 102b may be coupled with the first die 102a using interconnect structures 108 having the polymer core 226. The interconnect structures 108 may comport with embodiments described herein, including, for example, embodiments described in connection with FIG. 2. In some embodiments, the interconnect structures 108 may be configured to route electrical signals between one or more transistors formed on an active side S1 of the second die 102b and the TSVs 115 of the first die 102a. The second die 102b may have an inactive side S2 disposed opposite to the active side S1. Pads or pillars (e.g., pad or pillar 103 of FIG. 3C) may be formed on surfaces of the first die 102a and/or the second die 102b to form part of an electrical pathway between the second die 102b and the first die 102a or between the first die 102a and the substrate 104.

According to various embodiments, the first die 102a and the second die 102b may each represent a discrete chip composed of a semiconductor material and may be, include, or be a part of a processor, memory, or ASIC in some embodiments. An encapsulant material such as, for example, molding compound 109 or underfill material may fully or partially encapsulate the first die 102a and/or the second die 102b. In one embodiment, the first die 102a is a processor and the second die 102b is memory. In another embodiment, the first die 102a is memory and the second die 102b is memory. The first die 102a and/or the second die 102b may be configured to serve other functions in other embodiments.

In some embodiments, the substrate 104 is an epoxy-based laminate substrate having a core and/or build-up layers such as, for example, an Ajinomoto Build-up Film (ABF) substrate. The substrate 104 may include other suitable types of substrates in other embodiments including, for example, substrates formed from glass, ceramic, or semiconductor materials.

The substrate 104 may include electrical routing features configured to route electrical signals to or from the first die 102a and/or the second die 102b (e.g., through the first die 102a). The electrical routing features may include, for example, traces (not shown) disposed on one or more surfaces of the substrate 104 and/or internal routing features such as, for example, trenches, vias or other interconnect structures (not shown) to route electrical signals through the substrate 104. For example, in some embodiments, the substrate 104 may include electrical routing features such as die bond pads (not shown) configured to receive the die interconnect structures 106 and route electrical signals between the dies 102a, 102b and the substrate 104.

In some embodiments, the substrate 104 may have one or more pads (e.g., hereinafter "pads 110") disposed on a surface of the substrate 104 to electrically couple the substrate 104 with one or more other electrical components of an IC package assembly 100. The pads 110 may be composed of any suitable electrically conductive material such as metal including, for example, nickel (Ni), palladium (Pd), gold (Au), silver (Ag), or copper (Cu), or combinations thereof.

The substrate 104 may be coupled with a PoP component 111 through a molding compound 109 disposed on the surface of the substrate 104, as can be seen. For example, the substrate 104 may be coupled with the PoP component 111 using through-mold interconnects (hereinafter "TMIs 119") formed through the molding compound 109 and coupled with the pads 110. The PoP component 111 may include, for example, another die or another package substrate and may comport with embodiments described in connection with dies 102a, 102b or the substrate 104.

In some embodiments, the TMIs 119 may include interconnect structures 114 having a polymer core 226. In the depicted embodiment, the TMIs 119 further include solder balls 112 electrically coupled with electrically conductive material 224 of the interconnect structures 114. In other embodiments, the TMIs 119 may include the interconnect structures 114 having the polymer core 226 and not the solder balls 112.

In some embodiments, the substrate 104 may be coupled with a circuit board 122 using package-level interconnects 113. The package-level interconnects 113 may include, for example, solder balls 112 that form electrical joints between pads 110 on the substrate 104 and corresponding pads 117 on the circuit board 122. Other suitable package-level interconnects 113 may be used in other embodiments.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material, and the like. Structures (not shown) such as traces, trenches, vias may be formed through the electrically insulating layers to route the electrical signals of the substrate 104 (e.g., electrical signals of the dies 102a, 102b and/or the PoP component 111) through the circuit board 122. The circuit board 122 may be composed of other suitable materials in other embodiments. In some embodiments, the circuit board 122 is a motherboard (e.g., motherboard 802 of FIG. 8).

Figure 2:
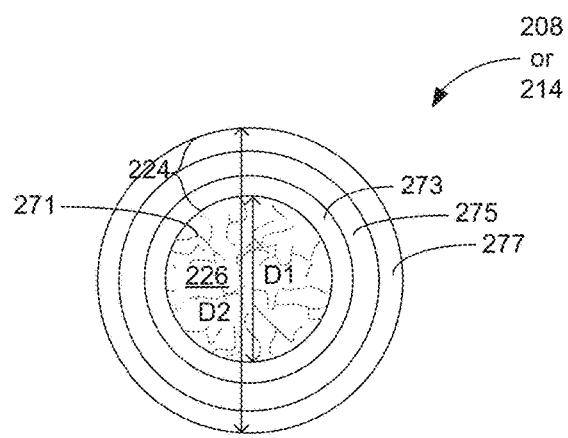
FIG. 2 schematically illustrates a cross-section view of an example interconnect structure having a polymer core, in accordance with some embodiments.

FIG. 2 schematically illustrates a cross-section view of an example interconnect structure 208 or 214 having a polymer core 226, in accordance with some embodiments. According to various embodiments, the interconnect structure 208 or 214 may represent a single interconnect structure of respective interconnect structures 108 or 114 described herein. The interconnect structure 208 or 214 may further include an electrically conductive material 224 disposed on the polymer core 226.

According to various embodiments, the polymer core 226 may be composed of a hyper-branched polymer. For example, in some embodiments, the polymer core 226 may be formed by chain growth polymerization and/or light cross-linking of aromatic species that can be grown into spheres of specified or predetermined size. The aromatic species may include two or more active reaction sites that can be sequentially polymerized. In some embodiments, seed metal layers of (Cu) or nickel (Ni) may be deposited (e.g., vacuum deposited) onto the polymer core 226. The deposited seed metal layers may be further electroplated or reacted with additional metal layers such as, for example, tin (Sn), silver (Ag), gold (Au) or Cu to form the electrically conductive material 224. The metal on the polymer core may be selected to provide specific metallurgies and/or intermetallic compounds desired for a given joint.

In an embodiment, the polymer core 226 is composed of one or more of macromolecules such as, for example, polystyrene, divinylbenzene and/or potentially high thermal stability polymers such as, for example, polyimides, polybenzooxazoles (PBOs) and/or polyamide-imides. The polymer core 226 may be composed of other suitable materials in other embodiments. In some embodiments, the polymer core 226 may be flexible. For example, under a force of compression, material of the polymer core 226 may flex and allow compression of the polymer core 226. A flexibility of the polymer core 226 may be tuned according to well-known techniques including, for example, a degree of cross-linking of polymers in the polymer core 226. A coefficient of thermal expansion (CTE) of the material of the polymer core 226 may be selected to reduce a likelihood that the polymer core 226 cracks the electrically conductive material 224 during or subsequent to thermal cycling (e.g., temperatures associated with semiconductor fabrication solder reflow processes). In some embodiments, the CTE of the polymer core 226 may be in a range of 70-80 ppm/° C. to match a CTE of underfill material.

The electrically conductive material 224 may include one or more layers of metal including, for example, solderable materials. In the depicted example embodiment, the electrically conductive material 224 includes three layers. In one embodiment, the electrically conductive material 224 includes a first layer 273 composed of Ni disposed on the polymer core 226, a second layer 275 composed of Cu disposed on the first layer 273 and a third layer 277 composed of tin-silver alloy (SnAg) disposed on the second layer 275. The electrically conductive material 224 may include more or fewer layers than depicted or other suitable materials for the first layer 273, second layer 275 and third layer 277.

The polymer core 226 may have a diameter, D1 and the interconnect structure 208 or 214 may have a diameter D2. The diameter D1 of the polymer core may be controlled within a relatively tight range (e.g., within ~1 micron) and may have a value from 1 micron to 60 microns in some embodiments. The diameter D2 of the interconnect structure 208 or 214 may have a value that is determined based on dimensions (e.g., length or diameter) and pitch of interconnect structures such as pads, bumps or pillars (e.g., pad or pillar 103 of FIG. 3C) on a die (e.g., first die 102a) or pads (e.g., pads 110 of FIG. 1) on a substrate (e.g., substrate 104 of FIG. 1). For example, in some embodiments, the diameter D2 may have a value ranging from 10 microns to 40 microns for embodiments where the interconnect structure 208 is used to electrically couple and/or provide a desired chip gap between two dies (e.g., first die 102a and second die 102b of FIG. 1). In some embodiments, the diameter D2 may have a value ranging from 160 microns to 240 microns for embodiments where the interconnect structure 214 is used to electrically couple a substrate with a PoP component (e.g., substrate 104 and PoP component 111 of FIG. 1). A ratio of diameter D1 to diameter D2 may be determined based on reliability performance of the resulting joint. In some embodiments, the diameter D1 is about ⅔ of the diameter D2. The interconnect structure 208 or 214 may have other dimensions including other suitable values for diameters D1 and D2 in other embodiments.

In some embodiments, the interconnect structure 208 or 214 may have a spherical profile, as depicted. The interconnect structure 208 or 214 may be configured in other suitable shapes in other embodiments.

Figure 3A:
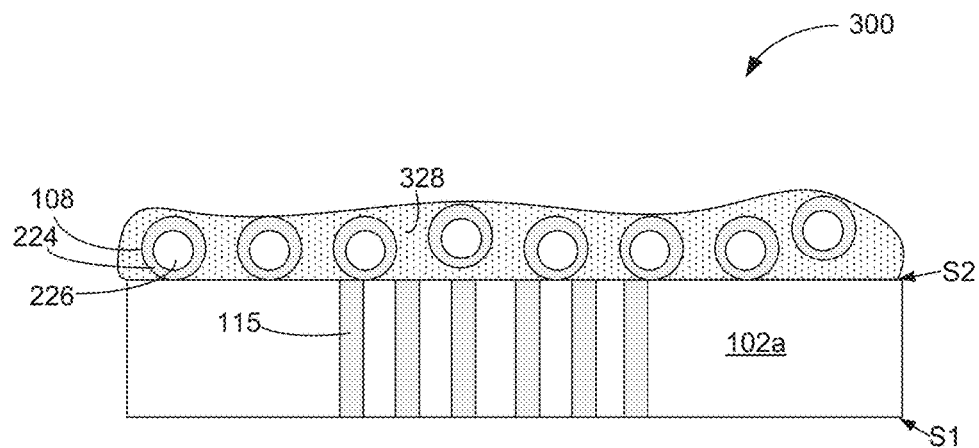
FIGS. 3A-C schematically illustrate an IC package assembly subsequent to various process operations, in accordance with various embodiments.
Figure 3B:
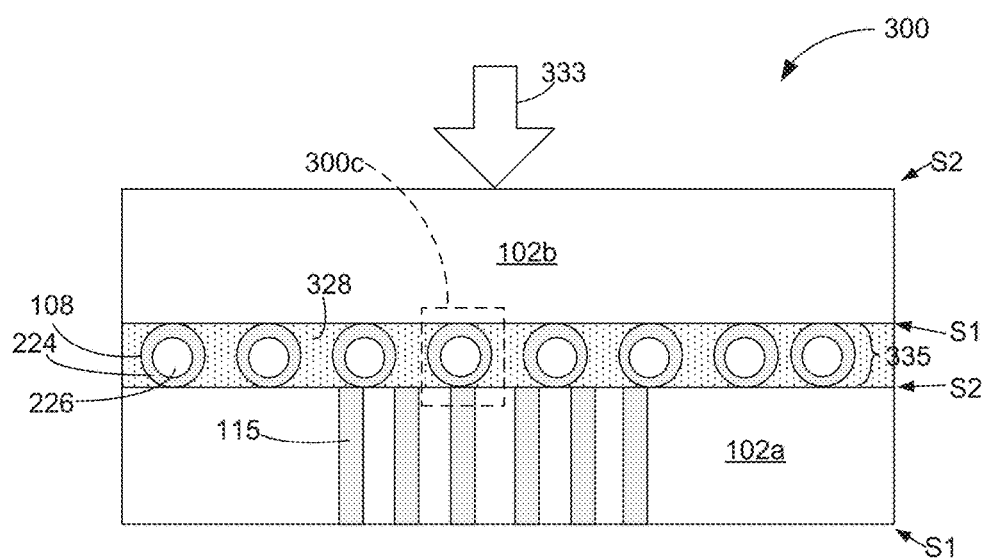
Figure 3C:
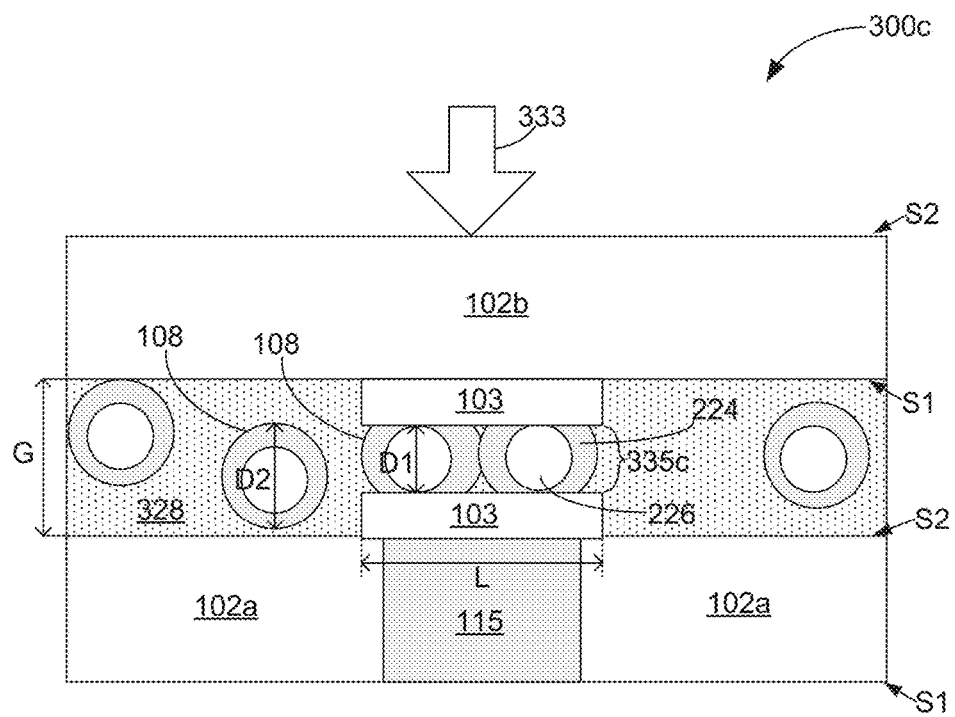

FIGS. 3A-C schematically illustrate an IC package assembly 300 subsequent to various process operations, in accordance with various embodiments. According to various embodiments, FIGS. 3A-C depict formation of an IC package assembly 300 that includes interconnect structures 108 configured to route electrical signals between two dies 102a, 102b.

FIG. 3A depicts an IC package assembly 300 subsequent to depositing interconnect structures 108 on an inactive side S2 of a first die 102a. The interconnect structures 108 include a polymer core 226 and an electrically conductive material 224 disposed on the polymer core 226.

In some embodiments, the interconnect structures 108 may be dispersed in a material system 328 that is dispensed on the first die 102a. The material system 328 may include, for example, one or more of solvent, flux and/or epoxy materials. In some embodiments, the interconnect structures 108 may be dispersed in a material system 328 including a polymer (e.g., epoxy material) that is deposited using a dispense technique to form an underfill between the first die 102a and a second die (e.g., second die 102b of FIG. 3B). In other embodiments, the interconnect structures 108 may be dispersed in flux and/or solvent that is dispensed prior to attachment of the second die with the first die 102a and an underfill material (e.g., epoxy material) may be deposited subsequent to the attachment. In still other embodiments, the interconnect structures 108 may be placed on pads or pillars (e.g., pad or pillar 103 of FIG. 3C) of the first die 102a or second die 102b without a material system 328 to deliver the interconnect structures 108. Other suitable techniques to deposit the interconnect structures 108 may be used in other embodiments.

The material system 328 may include a variety of components in addition to solvent, flux and/or epoxy including fillers to provide desirable mechanical properties and/or curing agents to tune a curing time and temperature of an epoxy, and the like. The material system 328 may include other suitable components in other embodiments.

FIG. 3B depicts the IC package assembly 300 subsequent to placing a second die 102b on the interconnect structures 108. The second die 102b may be attached with the first die 102a by heating the interconnect structures 108 to melt the electrically conductive material 224 of the interconnect structures 108 and form joints 335 between the electrically conductive material 224 and the dies 102a, 102b. The joints 335 may be configured to route electrical signals between the first die 102a and the second die 102b. A force (e.g., represented by arrow 333 in FIG. 3B) may be applied on the first die 102a and/or the second die 102b during heating of the electrically conductive material 224.

In some embodiments, placement of the second die 102b on the first die 102a and heating the electrically conductive material 224 may be performed using a bond head of equipment that is configured to form the joints 335 by thermocompression bonding (TCB). The second die 102b may be aligned with the first die 102a using the TCB equipment or any other suitable technique. Alignment accuracy between the dies may depend on size of the polymer core 226 and/or size and pitch of interconnect structures such as, for example, a size of pad or pillar 103 of FIG. 3C and pitch between adjacent pads or pillars on a same die surface. For example, in embodiments where the pad or pillar 103 of FIG. 3C has a length L of 40 microns and a corresponding pitch of the pad or pillar 103 is 40 microns from an adjacent pad or pillar, an alignment accuracy of about 5-10 microns may facilitate formation of a reliable joint. More accurate alignment may be generally desirable to facilitate formation of a reliable joint. In some embodiments, solder self-alignment techniques may be used to facilitate alignment of the first die 102a and the second die 102b. For example, the electrically conductive material 224 may provide pull-back and bump-centering alignment based on an amount of solderable material that melts and spreads on a pad or pillar (e.g., pad or pillar 103 of FIG. 3C) of the first die 102a. Other suitable techniques may be used to form the joints 335 via the interconnect structures 108 in other embodiments.

FIG. 3C depicts a portion 300c of the IC package assembly 300 in greater detail according to various embodiments. In some embodiments, the first die 102a may include a pad or pillar 103 disposed on the inactive side S2 of the first die 102a. The pad or pillar 103 of the first die 102a may be electrically coupled with one or more of the TSVs 115. The second die 102b may include a corresponding pad or pillar 103 disposed on an active side S1 of the second die 102b. The pad or pillar 103 of the second die 102b may be electrically coupled with one or more of the plurality of transistor devices of the second die 102b.

According to various embodiments, one or more of the interconnect structures 108 may be entrapped between the pad or pillar 103 of the first die 102a and the pad or pillar 103 of the second die 102b when the second die 102b is placed on the first die 102a. In the depicted embodiment and according to various embodiments, two or more of the interconnect structures 108 may be electrically coupled together to form a joint 335c (e.g., a single joint) between the pad or pillar 103 of the first die 102a and the pad or pillar 103 of the second die 102b. In this regard, the interconnect structures 108 in the material system 328 may serve as an anisotropic conductive layer between the first die 102a and the second die 102b.

In some embodiments, electrically conductive material 224 of the interconnect structures 108 is configured to form the joint 335c using a TCB process. A bond head of TCB equipment may be configured with a vacuum nozzle to hold, align and/or place the second die 102b on the first die 102a and apply a bonding force (e.g., represented by arrow 333) and ramp temperature to fuse the electrically conductive material 224 of the interconnect structures 108 together and with the pad or pillar 103 of the first die 102a and second die 102b.

Properties of an epoxy material of the material system 328 including, for example, viscosity and rheological properties may be selected, designed and/or optimized to facilitate flow of the epoxy material away from the pad or pillar 103 during placement of the second die 102b on the first die 102a to facilitate entrapment of the interconnect structures 108 between the pad or pillar 103 on the dies 102a, 102b. In some embodiments, an epoxy material having a medium to low viscosity and higher thixotropy may be used in the material system. For example, in an embodiment, the epoxy material may have a viscosity ranging from 10 pascal-second (Pas) to 20 Pas. Curing properties of the epoxy material may be configured to facilitate partial or full cure of the epoxy material during the thermal process to form the joint 335c.

In some embodiments, heating the electrically conductive material 224 to form the joint 335c may further thermally process the material system 328. For example, in embodiments where the material system 328 includes an epoxy material configured to serve as an underfill material, heating the electrically conductive material 224 may simultaneously partially or fully cure the epoxy material. In other embodiments where the material system 328 includes a solvent, the solvent may partially or fully evaporate during heating of the electrically conductive material 224. In embodiments where no epoxy material or similar material is used to help lock the interconnect structures 108 in place, a solderable material may be used for the electrically conductive material 224 to form a strong joint 335c.

In some embodiments, an underfill material may be deposited between the first die 102a and the second die 102b subsequent to forming the joints (e.g., joint 335c). The underfill material may include material of a molding compound (e.g., molding compound 109 of FIG. 1), in some embodiments, or material having a different chemical composition and/or deposited during a separate operation from the molding compound in other embodiments.

In some embodiments, some of the interconnect structures 108 may be dispersed and encapsulated in the material system 328 between the first die 102a and the second die 102b and also between adjacent joints of the joints (e.g., joints 335 of FIG. 3B). Such interconnect structures 108 may be electrically insulated from the electrically conductive material 224 of interconnect structures 108 that form the joints (e.g., joint 335c), as can be seen. For example, material of the material system 328 may electrically insulate some of the interconnect structures 108 that are not part of the joint 335c from interconnect structures 108 that are part of the joint 335c, as can be seen. In some embodiments, the joint 335c is configured to route electrical signals between the dies 102a, 102b. Interconnect structures 108 that do not form the joint 335c (or joints 335 of FIG. 3B) may not be configured to route the electrical signals.

According to various embodiments, a dimension (e.g., diameter D1) of the polymer core 226 is configured to control a collapse distance between the first die 102a and the second die 102b during heating and melting (e.g., reflow) of the electrically conductive material 224. In embodiments for spherically-shaped interconnect structures 108, a diameter D1 of the polymer core 226 may be configured to define a gap, G, between the first die 102a and the second die 102b. A flexibility of the polymer core 226 may be taken into consideration in determining the diameter D1 to provide the gap G. In some embodiments, the diameter D1 may represent a diameter of the polymer core 226 under bonding pressure force associated with forming the joint 335c. The flexibility of the polymer core 226 may provide a flexible joint 335c to reduce or otherwise mitigate stresses in the IC package assembly 300.

A size (e.g., diameters D1 and D2) and distribution (e.g., volume percent) of the interconnect structures 108 in the material system 328 may be selected, designed and/or optimized to provide a distribution of interconnect structures 108 to form the joints (e.g., joints 335 of FIG. 3B) without forming shorts between adjacent joints. In some embodiments, a volume percent (vol %) and/or size of the interconnect structures 108 in the material system 328 may be determined based on a pitch between adjacent joints (e.g., joints 335 of FIG. 3B), size of the pad or pillar 103, and desired gap G between the dies 102a and 102b. The volume percent and/or size of the interconnect structures 108 can be evaluated, for example, for defects such as solder bridging to provide a robust interconnect solution.

In some embodiments, the diameter D2 may be ⅓ to ¼ of a dimension or greater of the pad or pillar 103. For example, in some embodiments, the diameter D2 is greater than or equal to ⅓ to ¼ of a length, L, of the pad or pillar 103. In some embodiments, the pad or pillar 103 may have a length L ranging from 5 microns to 50 microns. In some embodiments, the length L of the pad or pillar 103 may be 20 microns and a pitch between adjacent pads or pillars disposed on a same surface may range from 40 microns to 50 microns. Other suitable values for length L or pitch may be used in other embodiments.

In some embodiments, a volume percent of interconnect structures 108 in the material system 328 may be less than 70%. In some embodiments, the volume percent of interconnect structures 108 in the material system 328 may be less than 10%. In one embodiment, the volume percent of interconnect structures 108 in the material system 328 is 5% in some embodiments. A volume percent of interconnect structures 108 in the material system 328 may depend on a particular application. For example, in embodiments where the interconnect structures 108 form joints that electrically route signals between dies, the volume percent of the interconnect structures may depend on size and pitch of the pad or pillar (e.g., pad or pillar 103) and may range between 1% by volume to 10% by volume of the material system 328. In embodiments where the interconnect structures 108 form joints that serve only as spacers between dies, the volume percent of the interconnect structures could range as high as 70-80% by volume of the material system 328.

Referring again to FIG. 3A, in other embodiments, the interconnect structures 108 may be deposited in a material system 328 on the first die 102a that is cross-linked to provide a B-stage epoxy material. The IC package assembly 300 having the partially cured epoxy material may be sent to a customer of the IC package assembly 300 for further assembly (e.g., as described in connection with FIGS. 3B-3C). The B-stage epoxy material may prevent flow of the material system 328 and movement of the interconnect structures 108 within the material system 328 to facilitate shipping of the IC package assembly 300c.

Figure 4A:
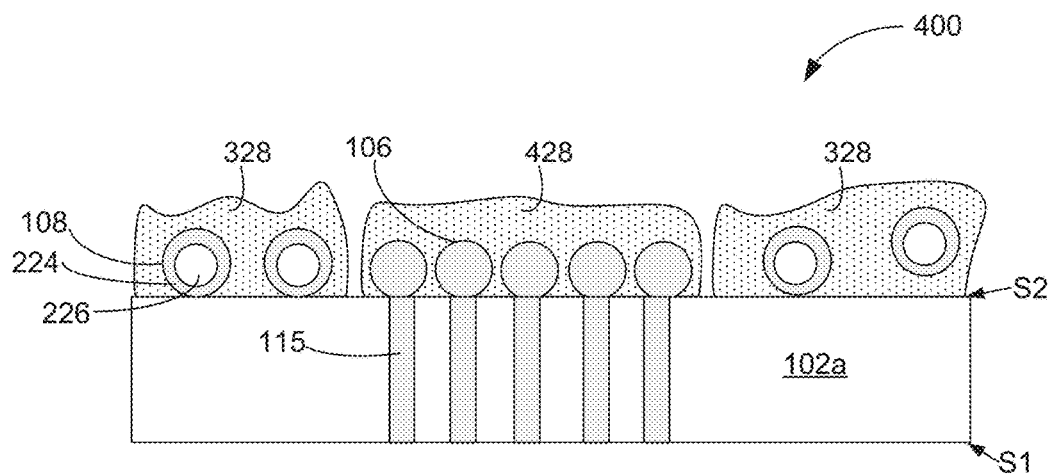
FIGS. 4A-C schematically illustrate another IC package assembly subsequent to various process operations, in accordance with various embodiments.
Figure 4B:
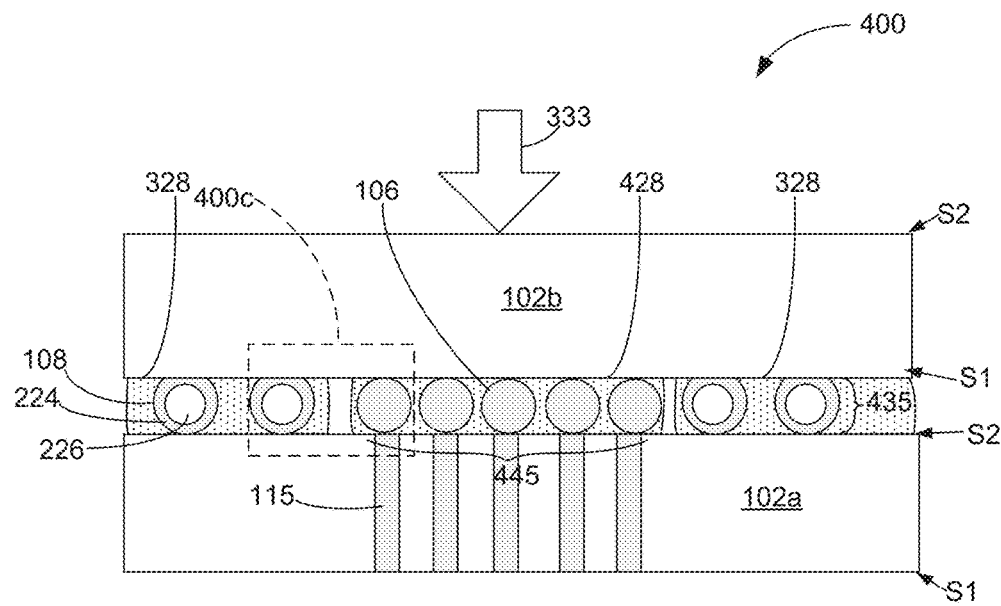
Figure 4C:
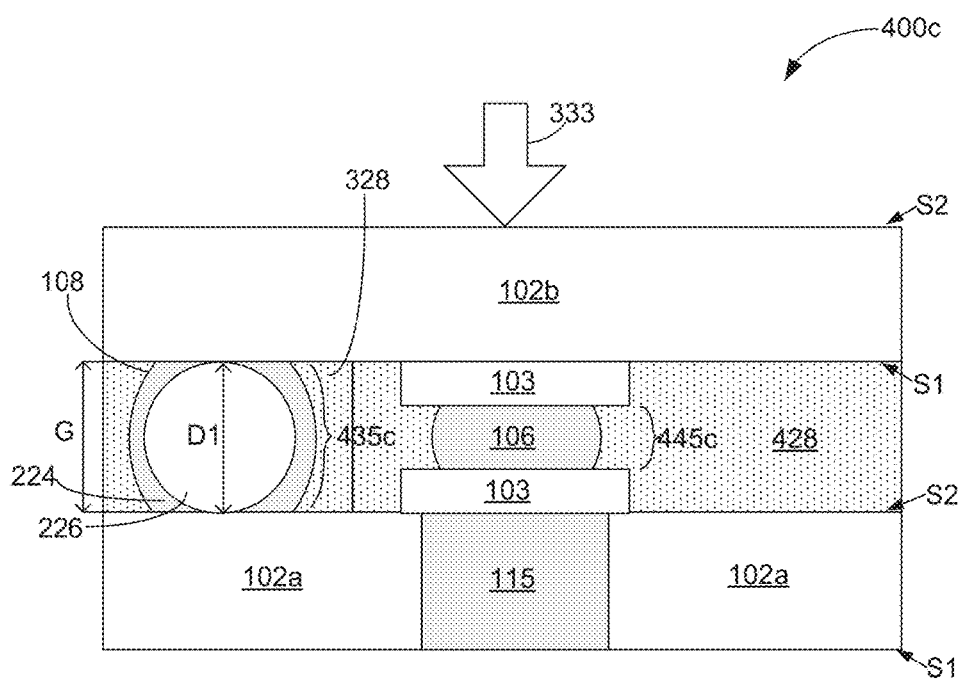

FIGS. 4A-C schematically illustrate another IC package assembly 400 subsequent to various process operations, in accordance with various embodiments. According to various embodiments, FIGS. 4A-C depict formation of an IC package assembly 400 that includes interconnect structures 108 configured to serve as spacers to define a gap (e.g., gap G of FIG. 4C) between two dies 102a, 102b. In some embodiments, the interconnect structures 108 of FIGS. 4A-C are not configured to route electrical signals between the dies 102a, 102b, but are rather configured to form joints.

FIG. 4A depicts an IC package assembly 400 subsequent to depositing interconnect structures 108 on an inactive side S2 of a first die 102a. The interconnect structures 108 include a polymer core 226 and an electrically conductive material 224 disposed on the polymer core 226.

The interconnect structures 108 may be deposited using techniques described in connection with FIGS. 4A-C in some embodiments. For example, the interconnect structures 108 may be deposited as part of deposition of material system 328 in some embodiments. In some embodiments, the interconnect structures 108 are deposited in a region away from or external to a region where pads or pillars (e.g., pad or pillar 103 of FIG. 4C) are located on the first die 102a to route electrical signals. In some embodiments, the interconnect structures 108 are deposited on a peripheral region of the first die 102a. According to various embodiments, the interconnect structures 108 may only include a polymer core 226 and no electrically conductive material 224 at all.

Die interconnect structures 106 may be deposited in a region where pads or pillars (e.g., pad or pillar 103 of FIG. 4C) are located on the first die 102a to route electrical signals. The die interconnect structures 106 may be composed of electrically conductive material such as metal, solder or combinations thereof. The die interconnect structures 106 may not have a polymer core 226 in some embodiments. However, in other embodiments the die interconnect structures 106 may include a polymer core 226 and/or otherwise may comport with embodiments described in connection with interconnect structures 108 of FIGS. 4A-C. The die interconnect structures 106 may have other shapes or configurations than depicted including, for example, an SOL configuration.

The die interconnect structures 106 may be deposited using techniques described in connection with depositing the interconnect structures 108 in FIGS. 3A-C, according to various embodiments. For example, in some embodiments, the die interconnect structures 106 may be deposited using a material system 428, which may comport with embodiments described in connection with material system 328 in some embodiments. In some embodiments, the material system 428 and material system 328 may have a same or similar chemical composition. In other embodiments, the material systems 328 and 428 may have differing chemical compositions. In one embodiment, the material system 328 and/or material system 428 includes epoxy and flux materials that are deposited by liquid dispense.

The die interconnect structures 106 may be electrically coupled with corresponding TSVs 115 to route electrical signals through the first die 102a, according to various embodiments. In some embodiments, the die interconnect structures 106 may include bumps or pillars formed according to well-known techniques.

FIG. 4B depicts the IC package assembly 400 subsequent to placing a second die 102b on the interconnect structures 108. The second die 102b may be attached with the first die 102a by heating the interconnect structures 108 to melt the electrically conductive material 224 of the interconnect structures 108 and form joints 435 between the electrically conductive material 224 and the dies 102a, 102b. The joints 435 may be configured to define a gap G between the dies 102a, 102b. According to various embodiments, the joints 435 are not configured to route electrical signals between the first die 102a and the second die 102b. According to various embodiments, the die interconnect structures 106, which may include solderable material deposited on pads or pillars of the dies 102a, 102b, may be simultaneously thermally processed with the interconnect structures 108 to melt and form joints 445 that are configured to route the electrical signals between the dies 102a, 102b.

A force (e.g., represented by arrow 333 in FIG. 4B) may be applied on the first die 102a and/or the second die 102b during heating of the electrically conductive material 224 to facilitate bonding and provide a desired gap between the dies 102a, 102b. According to various embodiments, a TCB technique as described in connection with FIGS. 3B-C may be used to simultaneously form joints 435 and 445. In some embodiments, the thermal process to form the joints may also simultaneously cure the material systems 328, 428.

FIG. 4C depicts a portion 400c of the IC package assembly 400 in greater detail according to various embodiments. In some embodiments, the first die 102a may include a pad or pillar 103 disposed on the inactive side S2 of the first die 102a. The pad or pillar 103 of the first die 102a may be electrically coupled with one or more of the TSVs 115. The second die 102b may include a corresponding pad or pillar 103 disposed on an active side S1 of the second die 102b. The pad or pillar 103 of the second die 102b may be electrically coupled with one or more of the plurality of transistor devices of the second die 102b.

According to various embodiments, one or more of the die interconnect structures 106 may be disposed between the pad or pillar 103 of the first die 102a and the pad or pillar 103 of the second die 102b when the second die 102b is placed on the first die 102a to form joint 445c. One of the interconnect structures 108 may be disposed between surfaces of the dies 102a, 102b such that electrically conductive material 224 forms a joint 435c between the dies 102a, 102b. The joint 445c may route electrical signals between the dies 102a, 102b and joint 435c may not route electrical signals, but may provide a spacer between the dies 102a, 102b. In some embodiments, the interconnect structures 108 may only include the polymer core 226 and not include any electrically conductive material 224. In such embodiments, the joint 435c may represent coupling of the dies 102a, 102b using the material system 328 where the polymer core 226 provides a spacer between the dies 102a, 102b.

A polymer core 226 of one or more of the interconnect structures 108 may have a diameter D1 that is configured to define a gap G, between the first die 102a and the second die 102b. In some embodiments, the diameter D1 has a same or similar value as the gap G. The diameter D1 of the polymer core 226 may be configured to control a collapse distance between the first die 102a and the second die 102b during heating and melting (e.g., reflow) of the electrically conductive material 224. In some embodiments, the diameter D1 and the gap G may be designed to provide a height of the die interconnect structures 106 (e.g., bulk solder joints) that prevents or reduces bulk solder wicking on the pad or pillar 103 of the dies 102a, 102b.

A flexibility of the polymer core 226 may be considered in determining a dimension (e.g., the diameter D1) of the interconnect structures 108 to provide the gap G. In some embodiments, the diameter D1 may represent a diameter of the polymer core 226 under bonding pressure force associated with forming the joint 435c. The flexibility of the polymer core 226 may provide a flexible joint 435c to reduce or otherwise mitigate stresses in the IC package assembly 400.

In some embodiments, the material systems 328, 428 may contact and/or merge during thermal processes to form joints 435c, 445c. In other embodiments, the material systems 328, 428 may not be in direct contact after such thermal processes.

According to various embodiments of FIGS. 3A-C and 4A-C, the dies 102a, 102b may be coupled together using die-to-wafer, die-to-die, or die-package-to-die techniques. That is, the first die 102a and/or the second die 102b may be in the form of a wafer, singulated die, or in a die-package when coupled together.

FIGS. 5A-F schematically illustrate yet another IC package assembly 500 subsequent to various process operations, in accordance with various embodiments. According to various embodiments, FIGS. 5A-F depict formation of an IC package assembly 500 that includes interconnect structures 114 formed on a substrate 104 and configured to route electrical signals between the substrate 104 and another electrical component (e.g., PoP component 111 of FIG. 5F). For example, the interconnect structures 114 may be configured to route electrical signals between a first die 102a coupled with the substrate 104 and a second die that is part of the PoP component 111 in some embodiments.

Figure 5A:
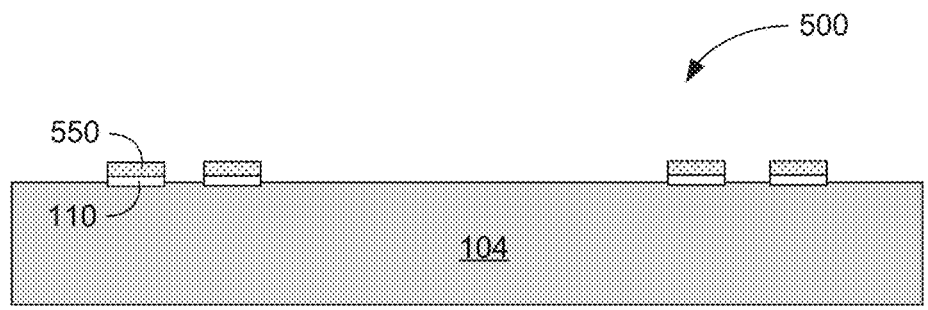
FIGS. 5A-F schematically illustrate yet another IC package assembly subsequent to various process operations, in accordance with various embodiments.

FIG. 5A depicts an IC package assembly 500 subsequent to depositing flux 550 on pads 110 disposed on a surface of the substrate 104, as can be seen. The pads 110 may be configured to form an electrical pathway between the substrate 104 and a PoP component 111 such as another substrate and/or die.

Figure 5B:
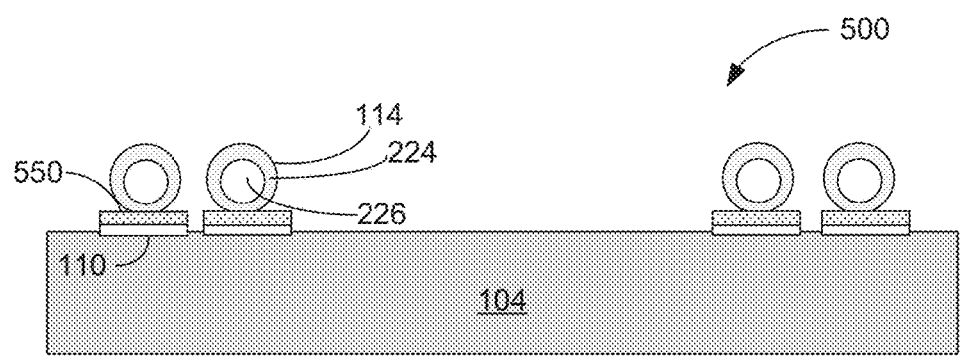

FIG. 5B depicts the IC package assembly 500 subsequent to depositing interconnect structures 114 on the flux 550 on the pads 110. The interconnect structures 114 include a polymer core 226 and an electrically conductive material 224 disposed on the polymer core 226. The interconnect structures 114 may be deposited using any suitable technique including dropping or placing the interconnect structures 114.

Figure 5C:
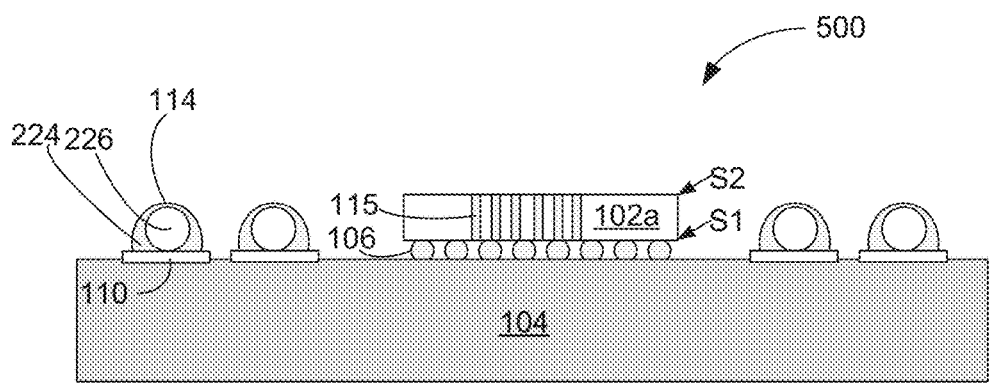

FIG. 5C depicts the IC package assembly 500 subsequent to thermal treatment (e.g., reflow) of the interconnect structures 114 to form joints between the electrically conductive material 224 and the pads 110. A first die 102a is attached to the substrate 104. In some embodiments, the first die 102a is coupled with the substrate 104 using die interconnect structures 106 according to techniques described herein. The die interconnect structures 106 may be reflowed to form joints during a same or different thermal treatment used to reflow the electrically conductive material 224 of the interconnect structures 114.

In some embodiments, a second die (e.g., second die 102b) may be coupled with the first die 102a in a configuration as described in connection with FIG. 1. The second die may be coupled with the first die 102a prior to or subsequent to attachment of the first die 102a with the substrate 104.

Figure 5D:
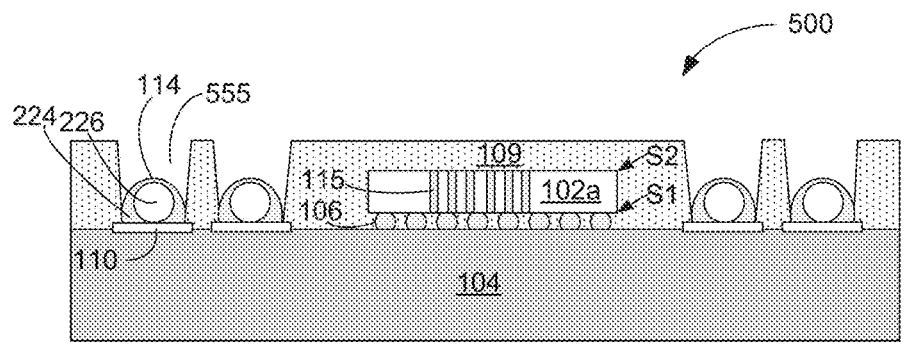

FIG. 5D depicts the IC package assembly 500 subsequent to forming a molding compound 109 having openings 555 to expose the interconnect structures 114. The molding compound 109 may, for example, be deposited to encapsulate the interconnect structures 114 and the first die 102a. Material of the molding compound 109 may be removed by laser drilling or other suitable technique to form the openings 555 and expose the interconnect structures 114.

Figure 5E:
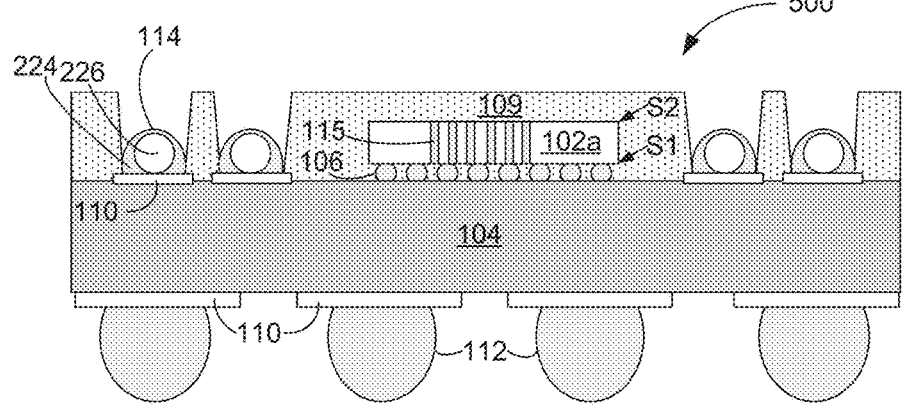

FIG. 5E depicts the IC package assembly 500 subsequent to forming package-level interconnects such as, for example, solder balls 112 coupled with pads 110. In some embodiments, the package-level interconnects may be formed on a surface of the substrate 104 disposed opposite to the surface on which the interconnect structures 114 are formed, as can be seen. In some embodiments, forming the package-level interconnects (e.g., depositing and reflowing solder balls 112) may be performed prior to any one or more of the actions described in connection with FIGS. 5A-D or subsequent to actions described in connection with FIG. 5F.

Figure 5F:
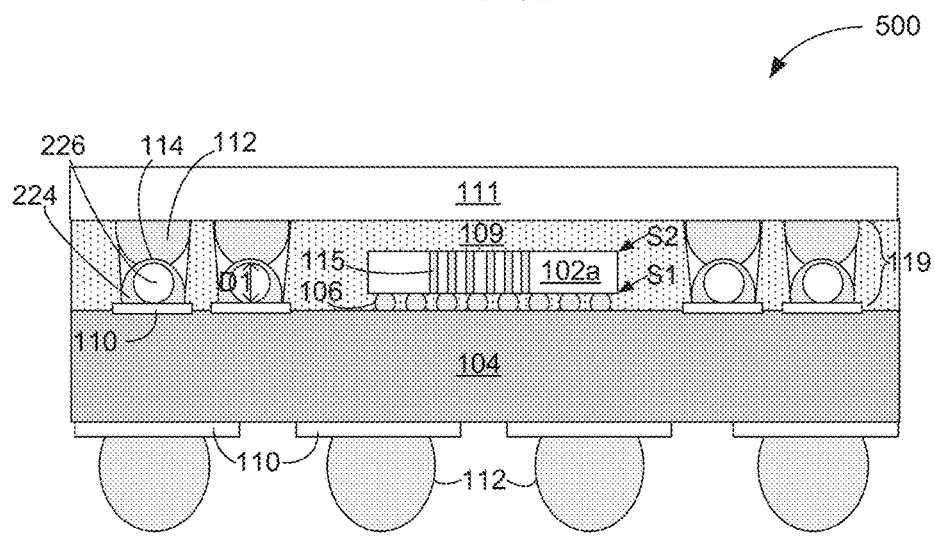

FIG. 5F depicts the IC package assembly 500 subsequent to coupling the PoP component 111 with the substrate 104 using the interconnect structures 114. In some embodiments, the PoP component 111 may include a substrate and/or die. In some embodiments, additional interconnect structures such as, for example, solder balls 112 may be coupled with the PoP component 111 and the PoP component 111 may be placed on the molding compound 109 such that the solder balls 112 are configured to form a part of through-mold interconnects (TMIs) 119. The solder balls 112 and the electrically conductive material 224 of the interconnect structures 114 may be thermally processed to reflow the materials and form joints (e.g., TMIs 119) between the substrate 104 and the PoP component 111.

In other embodiments, no solder balls 112 may be used and the electrically conductive material 224 may form a joint with features (e.g., pad or pillar) on the PoP component 111. In such embodiments, a height of the molding compound 109 relative to the surface of the substrate 104 may be smaller than depicted or a larger interconnect structure 114 may be used than depicted.

According to various embodiments, the polymer core 226 may facilitate control of height/collapse of the electrically conductive material 224 in the TMIs 119. For example, during reflow of the electrically conductive material 224, the polymer core 226 may hold a more spherical shape of the electrically conductive material 224 and/or prevent collapse of the electrically conductive material 224, making a height of the TMIs 119 more consistent and predictable. A diameter, D1, of the polymer core 226 may be designed or selected to target a particular height of materials in the TMIs 119. The polymer core 226 may be flexible, which may reduce joint stresses of the IC package assembly 500 including stresses associated with warpage during attachment of the PoP component 111.

In some embodiments, the electrically conductive material 224 may include a metal such as Cu or Au that may not adhere or wet at reflow temperatures. In such embodiments, a solderable material (e.g., solder balls 112) may be disposed on lands (not shown) of the PoP component 111 or pads 110 of the substrate 104 to facilitate joint formation with the electrically conductive material 224. The electrically conductive material 224 of the interconnect structures 114 may be selected for various implementations including shock performance or compatibility with memory bump metallurgy.

According to various embodiments, the interconnect structures 114 may be configured provide an electrical pathway (e.g., to route electrical signals) through the molding compound 109 between the first die 102a and the PoP component 111. In some embodiments, the PoP component 111 includes a memory module. In some embodiments, the PoP component 111 is a second die of the IC package assembly 500. In such embodiments, the second die may have an active side electrically coupled with the interconnect structures 114.

Figure 6:
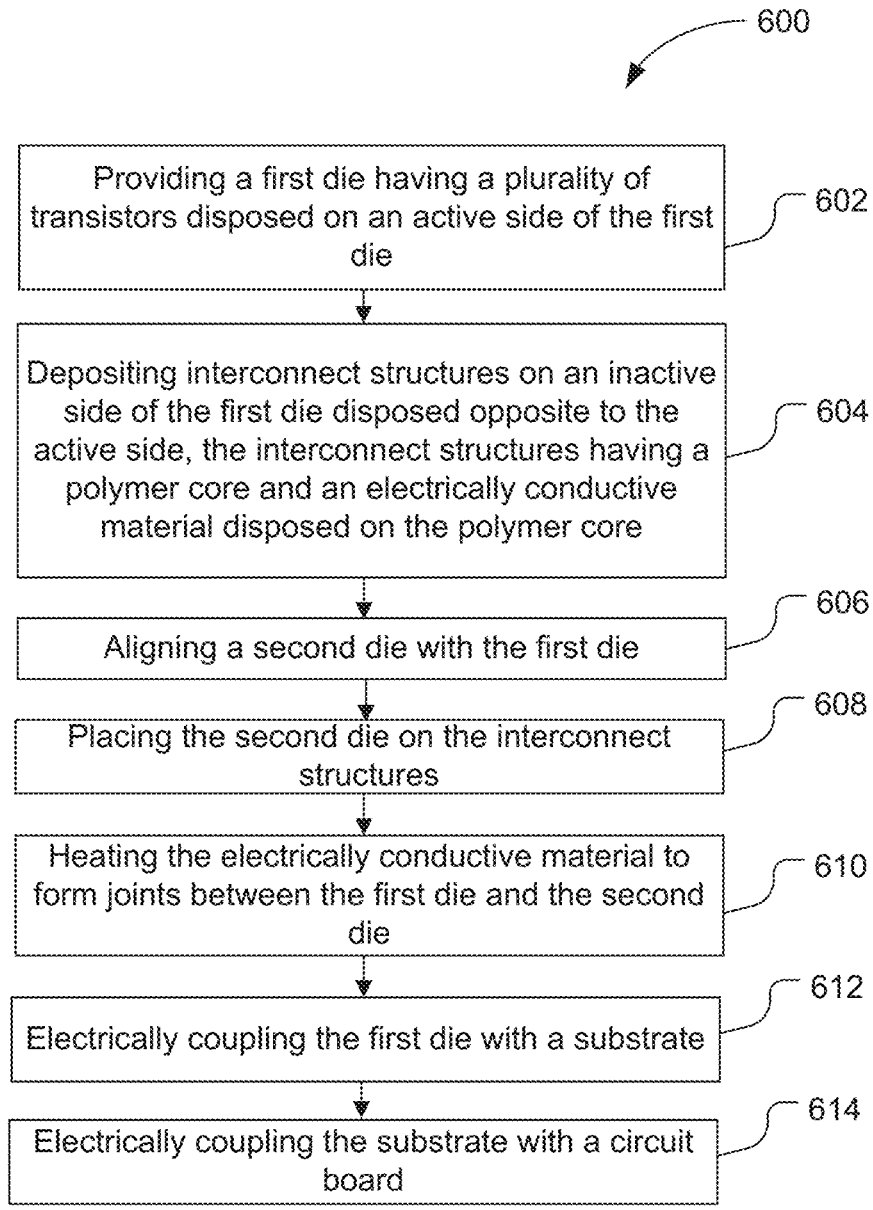
FIG. 6 schematically illustrates a flow diagram for a method of fabricating an IC package assembly, in accordance with some embodiments.

FIG. 6 schematically illustrates a flow diagram for a method 600 of fabricating an IC package assembly (e.g., IC package assembly 300 or 400 of respective FIG. 3A-C or 4A-C), in accordance with some embodiments. The method 600 may comport with embodiments described in connection with FIGS. 3A-C, 4A-C and vice versa.

At 602, the method 600 may include providing a first die (e.g., first die 102a of FIG. 3A or 4A) having a plurality of transistors disposed on an active side (e.g., active side S1 of FIG. 3A or 4A) of the first die. The first die may have TSVs (e.g., TSVs 115 of FIG. 3A or 4A) formed through the first die and pads or pillars (e.g., pad or pillar 103 of FIG. 3C or 4C) disposed on an inactive side (e.g., inactive side S1 of FIG. 3A or 4A). The pads or pillars may be electrically coupled with the TSVs.

At 604, the method 600 may include depositing interconnect structures (e.g., interconnect structures 108 of FIG. 3A or 4A) on an inactive side of the first die disposed opposite to the active side, the interconnect structures having a polymer (e.g., polymer core 226 of FIG. 3A or 4A) and an electrically conductive material (e.g., electrically conductive material 224 of FIG. 3A or 4A) disposed on the polymer core. The interconnect structures may be deposited, for example, according to techniques described in connection with FIG. 3A or 4A.

At 606, the method 600 may include aligning a second die (e.g., second die 102b of FIG. 3B or 4B) with the first die. At 608, the method 600 may include placing the second die on the interconnect structures. At 610, the method 600 may include heating the electrically conductive material to form joints (e.g., joints 335, 335c of FIGS. 3B-C or joints 435, 435c of FIGS. 4B-C) between the first die and the second die.

In some embodiments, any of the actions of aligning, placing and/or heating at 606, 606 and/or 608 may be simultaneously performed in a same fabrication equipment such as, for example, TCB equipment. Further actions may include, for example, applying a bonding pressure (e.g., indicated by arrow 333 in FIG. 3C or 4C) during heating at 610.

In some embodiments, the joints formed at 610 (e.g., joints 335, 335c of FIGS. 3B-C) may be configured to route electrical signals between the dies. In such embodiments, multiple interconnect structures 108 may be electrically coupled together to form a single joint subsequent to heating the electrically conductive material at 610 (e.g., as described in connection with FIG. 3C). In other embodiments, the formed joints (e.g., joints 435, 435c of FIGS. 4B-C) are not configured to route electrical signals between the dies, but may serve as spacers and/or stress mitigators between the dies. In either case of the formed joints, the interconnect structures may be configured to control a collapse distance between the first die and the second die during heating of the electrically conductive material to define a gap distance (e.g., gap G of FIG. 3C or 4C) between the dies.

At 610, the method 600 may include electrically coupling the first die with a substrate (e.g., substrate 104 of FIG. 5C). In some embodiments, the first die may be mounted in a flip-chip configuration on the substrate using a solder reflow process to form joints between the first die and the substrate using die interconnect structures (e.g., die interconnect structures 106 of FIG. 5C).

At 612, the method 600 may include electrically coupling the substrate with a circuit board (e.g., circuit board 122 of FIG. 1). The circuit board may be coupled with the substrate using any suitable technique including the techniques described in connection with FIG. 1.

Figure 7:
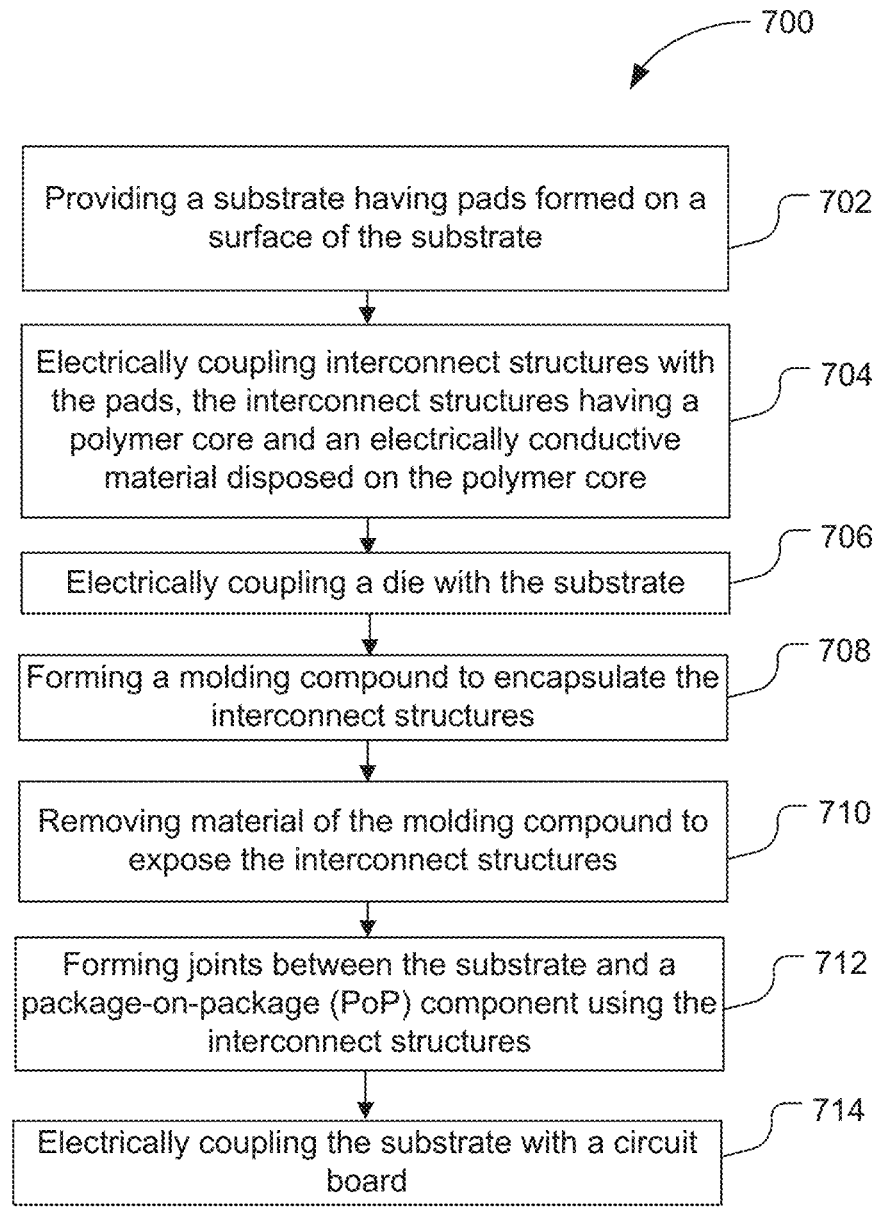
FIG. 7 schematically illustrates a flow diagram for another method of fabricating an IC package assembly, in accordance with some embodiments.

FIG. 7 schematically illustrates a flow diagram for another method 700 of fabricating an IC package assembly (e.g., IC package assembly 500 of FIGS. 5A-C), in accordance with some embodiments. The method 700 may comport with embodiments described in connection with FIGS. 5A-C and vice versa.

At 702, the method 700 may include providing a substrate (e.g., substrate 104 of FIG. 5A) having pads (e.g., pads 110 of FIG. 5A) formed on a surface of the substrate. The substrate may comport with embodiments described in connection with substrate 104 of FIG. 1.

At 704, the method 700 may include electrically coupling interconnect structures (e.g., interconnect structures 114 of FIGS. 5B-C) with the pads, the interconnect structures having a polymer core (e.g., polymer core 226 of FIGS. 5A-B) and an electrically conductive material (e.g., electrically conductive material 224 of FIGS. 5A-B) disposed on the polymer core. The interconnect structures may be electrically coupled with the substrate using a solder reflow process to form a bond between the electrically conductive material of the interconnect structures and the pads on the substrate.

At 706, the method 700 may include electrically coupling a die (e.g., first die 102a of FIG. 5C) with the substrate. In some embodiments, multiple dies may be electrically coupled with the substrate in stacked or side-by-side configurations.

At 708, the method 700 may include forming a molding compound (e.g., molding compound 109 of FIG. 5D) to encapsulate the interconnect structures. The molding compound may be formed to encapsulate the die or dies on the substrate in some embodiments.

At 710, the method 700 may include removing material of the molding compound to expose the interconnect structures. For example, in some embodiments, material of the molding compound may be selectively removed by a laser drilling technique to provide openings (e.g., openings 555 of FIG. 5D) in the molding compound over the interconnect structures.

At 712, the method 700 may include forming joints (e.g., TMIs 119 of FIG. 5F) between the substrate and a package-on-package (PoP) component (e.g., PoP component 111 of FIG. 5F) using the interconnect structures. The joints may be formed, for example, by using a solder reflow process to form bonds between the electrically conductive material of the interconnect structures and the PoP component (e.g., another substrate and/or another die).

At 714, the method 700 may include electrically coupling the substrate with a circuit board (e.g., circuit board 122 of FIG. 1). The circuit board may be coupled with the substrate using any suitable technique including the techniques described in connection with FIG. 1.

Embodiments described herein may be suitably combined in some embodiments. For example, dies may be coupled using interconnect structures according to techniques described in connection with FIG. 3A-C or 4A-C and such dies may be coupled with a substrate that is coupled with a PoP component using techniques described in connection with FIGS. 5A-C to provide an IC package assembly (e.g., IC package assembly 100 of FIG. 1). Various operations are described as multiple discrete operations in turn, in a manner that is most helpful in understanding the claimed subject matter. However, the order of description should not be construed as to imply that these operations are necessarily order dependent.

Techniques and configurations described in connection with interconnect structures having a polymer core as described herein may provide a variety of benefits for forming joints between dies and/or substrates and, in particular, for package assemblies having tighter pitch between the joints and assembled using TCB techniques. The interconnect structures described herein may facilitate controlled collapse of solderable materials. An outer layer of solder or metal on the polymer core may be controlled from a few nanometers to tens of microns. In some embodiments where only the outer layer is involved in forming the joint, use of the interconnect structures may prevent or reduce solder wicking or solder squeezing enabling tighter bump pitches without solder bridging.

A size (e.g., diameter D1 of FIG. 2) of the interior polymer core may be predefined and precisely controlled within a range of ~1-2 microns, enabling precise chip gap (e.g., gap G of FIG. 3C or 4C) control without having to rely on TCB bonding force or retract force.

Flexibility of the polymer core may allow for increased joint flexibility to mitigate expansion/contraction or other stresses due to thermal processing (e.g., CTE mismatch of materials in an IC package assembly). Such flexibility of the polymer core may reduce joint reliability defects or failures such as cracking of interlayer dielectric (ILD) in the dies or substrate.

In embodiments described for FIGS. 3A-C, entrapment of the interconnect structures between pillars or pads on the dies may be desirable to facilitate formation of joints between dies during TCB bonding of the dies for a single operation epoxy (e.g., material system 328 of FIG. 3A) dispense process performed prior to TCB bonding. The single operation epoxy may refer to a single deposition operation for the interconnect structures and an underfill material between the dies, according to various embodiments.

In embodiments described for FIGS. 5A-F, the interconnect structures may facilitate formation of low z-height PoP assemblies by increasing control of solder height within TMIs. The solder height within the TMIs may have a particular target height based on overall height of the molding compound, die thickness, package warpage, or other considerations. The polymer core of the interconnect structures may further reduce solder collapse and mitigate ball merge/solder bridging defects in the TMIs.

The interconnect structures may also facilitate achievement of larger solder heights in TMIs because the polymer core occupies some of the space and structurally reinforces the interconnect structures where larger bulk solder material may collapse for a same solder height in the TMIs. Larger solder heights may be particularly beneficial for package assemblies where die thickness (and consequently mold thickness) is larger to mitigate effects of warpage. Other benefits of using the interconnect structures with polymer core in an IC package assembly may be described herein.

Figure 8:
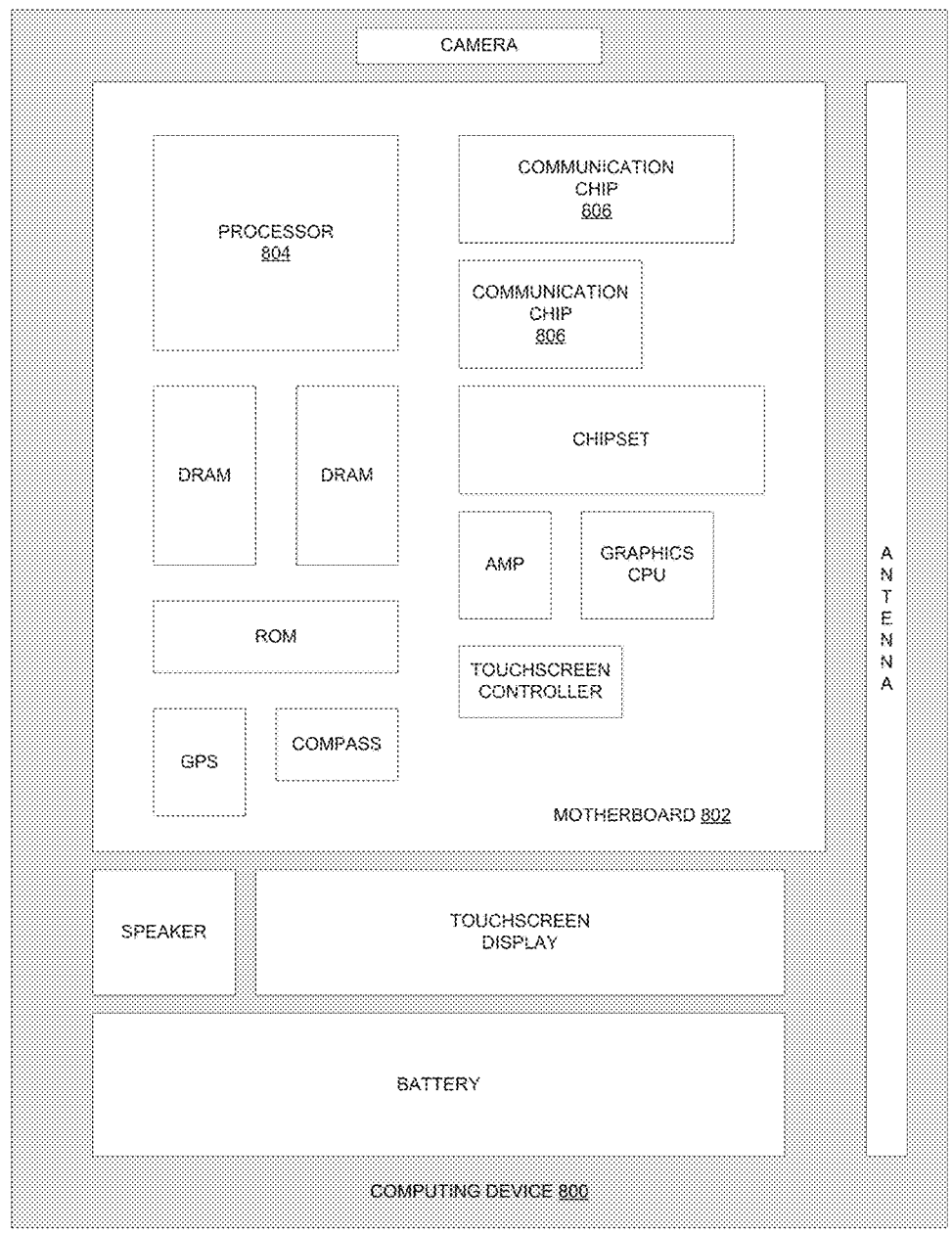
FIG. 8 schematically illustrates a computing device, in accordance with some embodiments.

Embodiments of the present disclosure may be implemented into a system using any suitable hardware and/or software to configure as desired. FIG. 8 schematically illustrates a computing device 800, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may include a die (e.g., first die 102a) in an IC package assembly (e.g., IC package assembly 100 of FIG. 1) as described herein. For example, the circuit board 122 of FIG. 1 may be a motherboard 802 and the processor 804 may be a first die 102a mounted on a substrate 104 of FIG. 1. The die of the processor 804 may be coupled with another die (e.g., memory) according to techniques described in connection with FIG. 3A-C or 4A-C and/or the substrate 104 may be coupled with a PoP component 111 according to techniques described in connection with FIGS. 5A-F. The term "processor" may refer to any device or portion of a device that processes electronic data from registers and/or memory to transform that electronic data into other electronic data that may be stored in registers and/or memory.

The communication chip 806 may also include a die in an IC package assembly as described herein. In further implementations, another component (e.g., memory device or other integrated circuit device) housed within the computing device 800 may include a die in an IC package assembly as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes an apparatus or integrated circuit assembly comprising a first die having a plurality of transistor devices disposed on an active side of the first die and a plurality of interconnect structures electrically coupled with the first die, wherein individual interconnect structures of the plurality of interconnect structures have a polymer core, and an electrically conductive material disposed on the polymer core, the electrically conductive material being configured to route electrical signals between the transistor devices of the first die and a second die.

In some embodiments, the polymer core includes one of polystyrene, divinylbenzene, polyimide, polybenzooxazole (PBO) or polyamide-imide, the polymer core has a diameter in a range from 1 micron to 60 microns; and the electrically conductive material includes copper (Cu) or nickel (Ni)

coupled with the polymer core and one or more of tin (Sn), silver (Ag), gold (Au) or Cu coupled with the Cu or Ni.

In some embodiments, the apparatus or integrated circuit assembly may further include the second die, wherein the first die has a plurality of through-silicon vias (TSVs) configured to electrically couple an inactive side of the die with the plurality of transistor devices disposed on the active side of the die and the second die is mounted in a flip-chip configuration on the inactive side of the first die using the individual interconnect structures to electrically couple the second die with the TSVs of the first die. In some embodiments, the polymer core is configured to control a collapse distance between the first die and the second die during reflow of the electrically conductive material to define a gap distance between the first die and the second die. In some embodiments, the first die includes a pad or pillar disposed on the inactive side of the first die and electrically coupled with a through-silicon via (TSV) of the TSVs, the second die includes a pad or pillar disposed on an active side of the second die and electrically coupled with a plurality of transistor devices disposed on the active side of the second die, and multiple of the individual interconnect structures are electrically coupled together to form a single joint between the pad or pillar of the first die and the pad or pillar of the second die. In some embodiments, the individual interconnect structures are dispersed in an underfill material that is disposed between the first die and the second die. In some embodiments, the individual interconnect structures are first individual interconnect structures and the apparatus or integrated circuit assembly further comprises second individual interconnect structures of the plurality of interconnect structures, the second individual interconnect structures being dispersed in the underfill material and having a polymer core, and an electrically conductive material disposed on the polymer core, the electrically conductive material of the second interconnect structures being electrically insulated from the electrically conductive material of the first interconnect structures by the underfill material, wherein the second individual interconnect structures are not configured to route the electrical signals. In some embodiments, the individual interconnect structures are dispersed in an epoxy material disposed on an inactive side of the first die that is disposed opposite to the active side of the first die, the epoxy material is cross-linked to provide a B-stage epoxy material and the electrically conductive material of the individual interconnect structures is configured to form a joint between the first die and the second die using a thermocompression bonding (TCB) process.

In some embodiments, the apparatus or integrated circuit assembly further comprises a substrate having pads formed on a surface of the substrate, wherein the first die is electrically coupled with the pads and a molding compound disposed on the surface of the substrate, wherein the individual interconnect structures are disposed on the pads and configured to provide an electrical pathway through the molding compound between the first die and the second die. In some embodiments, the apparatus or integrated circuit assembly further comprises the second die, wherein an active side of the second die is electrically coupled with the individual interconnect structures. In some embodiments, the first die is a processor or memory and the second die is memory.

According to various embodiments, the present disclosure describes a method of fabricating an integrated circuit assembly comprising providing a first die having a plurality of transistor devices disposed on an active side of the first die and depositing a plurality of interconnect structures on an inactive side of the first die disposed opposite to the active side, wherein individual interconnect structures of the plurality of interconnect structures have a polymer core, and an electrically conductive material disposed on the polymer core, the electrically conductive material being configured to route electrical signals between the transistor devices of the first die and a second die. In some embodiments, depositing the plurality of interconnect structures is performed by liquid dispense of a solvent or epoxy material, wherein the plurality of interconnect structures are dispersed in the solvent or epoxy material.

In some embodiments, the method further comprises aligning the second die with the first die, placing the second die on the plurality of interconnect structures disposed on the inactive side of the first die and heating the electrically conductive material of the plurality of interconnect structures to form joints between the first die and the second die, wherein the polymer core is configured to control a collapse distance between the first die and the second die during heating of the electrically conductive material to define a gap distance between the first die and the second die. In some embodiments, placing the second die and heating the electrically conductive material is performed using a bond head of equipment configured to form the joint by thermocompression bonding (TCB). In some embodiments, heating the electrically conductive material further evaporates the solvent or cures the epoxy material. In some embodiments, the first die has a plurality of through-silicon vias (TSVs) configured to electrically couple an inactive side of the die with the plurality of transistor devices disposed on the active side of the die, the first die includes a pad or pillar disposed on the inactive side of the first die and electrically coupled with a through-silicon via (TSV) of the TSVs, the second die includes a pad or pillar disposed on an active side of the second die and electrically coupled with a plurality of transistor devices disposed on the active side of the second die, and placing the second die further comprises placing the second die in a flip-chip configuration on the first die, wherein multiple interconnect structures of the plurality of interconnect structures are electrically coupled together to form a single joint of the joints between the pad or pillar of the first die and the pad or pillar of the second die subsequent to heating the electrically conductive material of the plurality of interconnect structures. In some embodiments, depositing the plurality of interconnect structures is performed by liquid dispense of epoxy material and at least some of the interconnect structures of the plurality of interconnect structures are dispersed in the underfill material and electrically insulated from the joints.

In some embodiments, depositing the plurality of interconnect structures is performed by liquid dispense of epoxy material and the epoxy material is cross-linked to provide a B-stage epoxy material. In some embodiments, the plurality of interconnect structures are first interconnect structures, the method further comprising providing a substrate, the substrate having pads formed on a surface of the substrate, electrically coupling second interconnect structures with the pads, the second interconnect structures including a polymer core and an electrically conductive material disposed on the polymer core, electrically coupling the first die with the substrate, forming a molding compound to encapsulate the second interconnect structures and the first die, removing material of the molding compound to expose the second interconnect structures and forming joints between the substrate and another substrate or a third die using the second interconnect structures, wherein the second interconnect structures are configured to route electrical signals between the substrate and the another substrate or the third die.

According to various embodiments, the present disclosure describes a system or computing device comprising a circuit board, a first die electrically coupled with the circuit board and having a plurality of transistor devices disposed on an active side of the first die and a plurality of interconnect structures electrically coupled with the first die, wherein individual interconnect structures of the plurality of interconnect structures have a polymer core, and an electrically conductive material disposed on the polymer core, the electrically conductive material being configured to route electrical signals between the transistor devices of the first die and a second die. In some embodiments, the system or computing device further comprises the second die, wherein the first die has a plurality of through-silicon vias (TSVs) configured to electrically couple an inactive side of the die with the plurality of transistor devices disposed on the active side of the die and the second die is mounted in a flip-chip configuration on the inactive side of the first die using the individual interconnect structures to electrically couple the second die with the TSVs of the first die. In some embodiments, the system further comprises a substrate electrically coupled with the circuit board, the substrate having pads formed on a surface of the substrate, wherein the first die is electrically coupled with the pads, a molding compound disposed on the surface of the substrate, wherein the individual interconnect structures are disposed on the pads and configured to provide an electrical pathway through the molding compound between the first die and the second die and the second die, wherein an active side of the second die is electrically coupled with the individual interconnect structures. In some embodiments, the first die is a processor or memory and the second die is memory.

In some embodiments, the system or computing device comprises one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board. In some embodiments, the system or computing device is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments described in conjunctive form (and) above (e.g., the "and" may be "and/or"). Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
   providing a substrate having pads formed on a surface of the substrate;
   electrically coupling interconnect structures with the pads, the interconnect structures having a polymer core, an electrically conductive material disposed on the polymer core, and solder balls directly coupled with the electrically conductive material disposed on the polymer core;
   forming a molding compound on the surface of the substrate; and
   coupling a package-on-package (PoP) component with the substrate, including: placing the PoP component on the molding compound and electrically coupling the PoP with the pads of the substrate through the electrically conductive material of the individual interconnect structures, which includes placing a solder ball of an individual interconnect structure directly adjacent to the PoP, and placing the electrically conductive material disposed on the polymer core of an individual interconnect structure directly adjacent to a pad of the pads formed on the surface of the substrate.

2. The method of claim 1, wherein electrically coupling the interconnect structures with the pads comprises using a thermal treatment to reflow the electrically conductive material of the interconnect structures and form joints between the electrically conductive material and the pads.

3. The method of claim 1, further comprising:
   partially removing material of the molding compound to form openings that expose the interconnect structures.

4. The method of claim 3, further comprising:
   wherein the interconnect structures are configured to provide an electrical pathway through the molding compound between the PoP component and the substrate.

5. The method of claim 4, wherein:
   coupling the PoP component with the substrate further comprises thermally processing the solder balls and the electrically conductive material to reflow the solder balls and the electrically conductive material to form joints between the substrate and the PoP component.

6. The method of claim 1, further comprising: electrically coupling a die with the substrate.

7. The method of claim 1, further comprising:
   electrically coupling a circuit board with the substrate.

* * * * *